United States Patent [19]

Godek et al.

[11] Patent Number: 5,565,837
[45] Date of Patent: *Oct. 15, 1996

[54] LOW PROFILE PRINTED CIRCUIT BOARD

[75] Inventors: Paul W. Godek, Brockton; Michael J. Grennan, Hull, both of Mass.

[73] Assignee: Nidec America Corporation, Torrington, Conn.

[*] Notice: The term of this patent shall not extend beyond the expiration date of Pat. No. 5,321,380.

[21] Appl. No.: 259,307

[22] Filed: Jun. 13, 1994

Related U.S. Application Data

[63] Continuation-in-part of Ser. No. 973,042, Nov. 6, 1992, Pat. No. 5,321,380.

[51] Int. Cl.⁶ .................................................. H01F 27/28
[52] U.S. Cl. ........................... 336/232; 336/200; 336/83; 174/250; 174/260
[58] Field of Search ................................ 336/200, 232, 336/83, 196, 198; 174/258, 250, 260, 266

[56] References Cited

U.S. PATENT DOCUMENTS

| | | | |
|---|---|---|---|
| 3,129,398 | 4/1964 | Lheureux | 336/200 |
| 3,161,850 | 12/1964 | Klug . | |
| 3,436,687 | 4/1969 | Andrews, Jr. et al. | 333/29 |
| 3,484,697 | 12/1969 | Abend | 325/373 |
| 3,504,276 | 3/1970 | Proctor et al. | 324/37 |
| 3,539,309 | 11/1970 | Helgeland | 29/593 |
| 3,549,825 | 12/1970 | Trimble | 179/100.2 |
| 3,685,144 | 8/1972 | Trimble | 29/603 |
| 3,736,543 | 5/1973 | Lademann et al. | 336/200 |
| 4,012,703 | 3/1977 | Chamberlayne | 333/24 R |
| 4,223,290 | 9/1980 | Agatahama et al. | 335/229 |
| 4,494,100 | 1/1985 | Stengel et al. | 336/200 |
| 4,543,553 | 9/1985 | Mandai et al. | 336/83 |
| 4,547,961 | 10/1985 | Bokil et al. | 336/200 |
| 4,622,627 | 11/1986 | Rodriguez et al. | 363/37 |
| 4,651,254 | 3/1987 | Brede et al. | 361/248 |
| 5,010,314 | 4/1991 | Estrov | 336/198 |
| 5,032,815 | 7/1991 | Kobayashi et al. | 336/83 |
| 5,039,964 | 8/1991 | Ikeda | 336/200 |
| 5,067,230 | 11/1991 | Meunier et al. | 29/603 |
| 5,319,342 | 6/1991 | Kuroki | 336/170 |
| 5,353,001 | 10/1994 | Meinel | 336/83 |

FOREIGN PATENT DOCUMENTS

| | | | |
|---|---|---|---|
| 0267108 | 5/1968 | European Pat. Off. | 336/200 |
| 0318955 | 6/1989 | European Pat. Off. | 336/83 |
| 3721759 | 1/1989 | Germany | 336/200 |
| 85/00072 | 1/1985 | WIPO | 336/200 |

OTHER PUBLICATIONS

IBM Technical Disclosure Bulletin, vol. 19, No. 10, Mar. 1977, "Double Flat Coil For Bubble Memory Package", pp. 3713–3714.

*Primary Examiner*—Laura Thomas
*Attorney, Agent, or Firm*—McCormick, Paulding & Huber

[57] ABSTRACT

In a low-profile printed circuit device, a first substrate is provided with a planar magnetic transformer and a planar magnetic inductor. The transformer and the inductor each have a primary winding defining spiral conductive patterns disposed on opposite sides of the first substrate relative to each other, and an inductive core extending through a respective inner aperture formed through the first substrate and surrounded by the respective primary winding. A second substrate is also provided, having a secondary transformer winding and a secondary inductor winding. Each secondary winding defines respective spiral conductive patterns disposed on opposite sides of the second substrate, and surrounding respective inner apertures extending through the second substrate. The second substrate is surface mounted onto the first substrate, with the secondary transformer winding overlying the primary transformer winding, and the secondary inductor winding overlying the primary inductor winding, so that each secondary winding generates an additional electrical output. Dielectric coatings cover both sides of each of the first and second substrates, and each defines margin portions covering the surfaces defining each inner aperture. Each margin portion projects into the aperture toward the respective inductive core for insulating the windings relative to each other and relative to the cores.

17 Claims, 3 Drawing Sheets

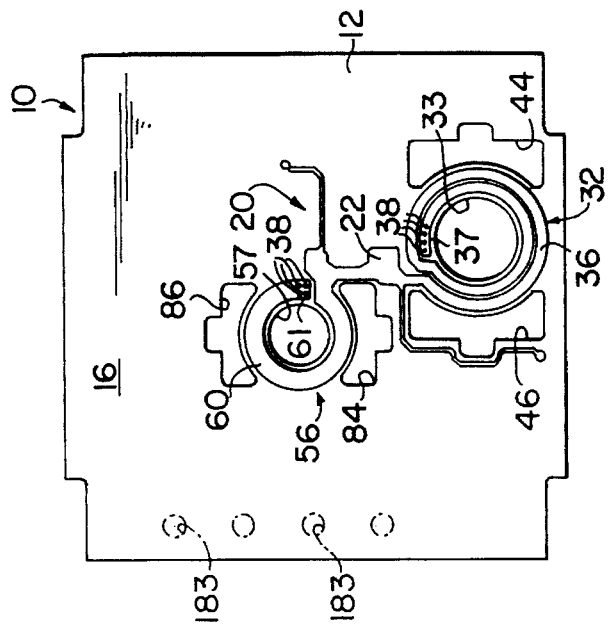
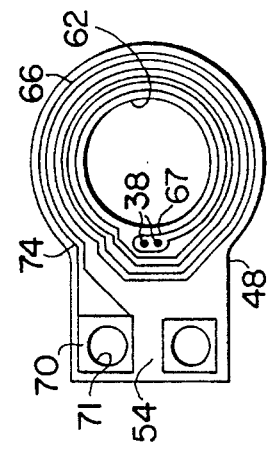
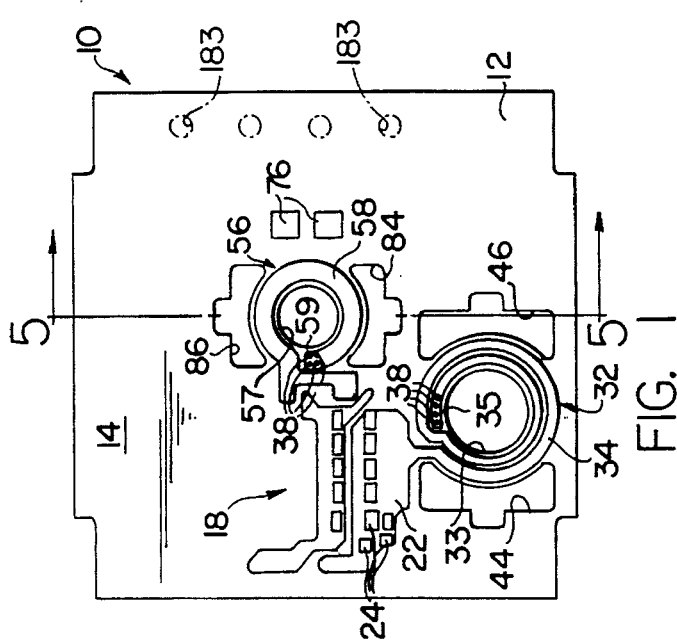
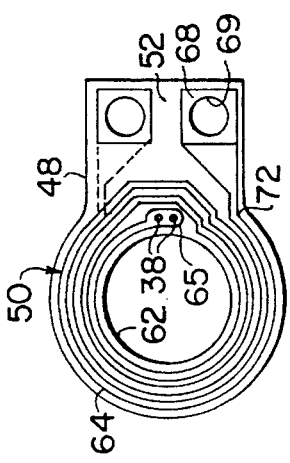

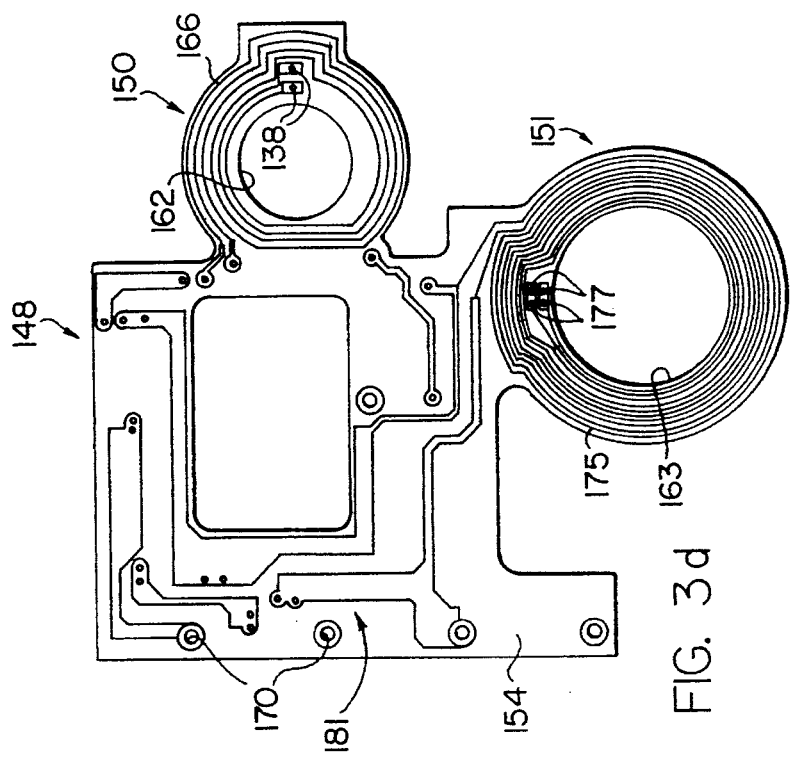
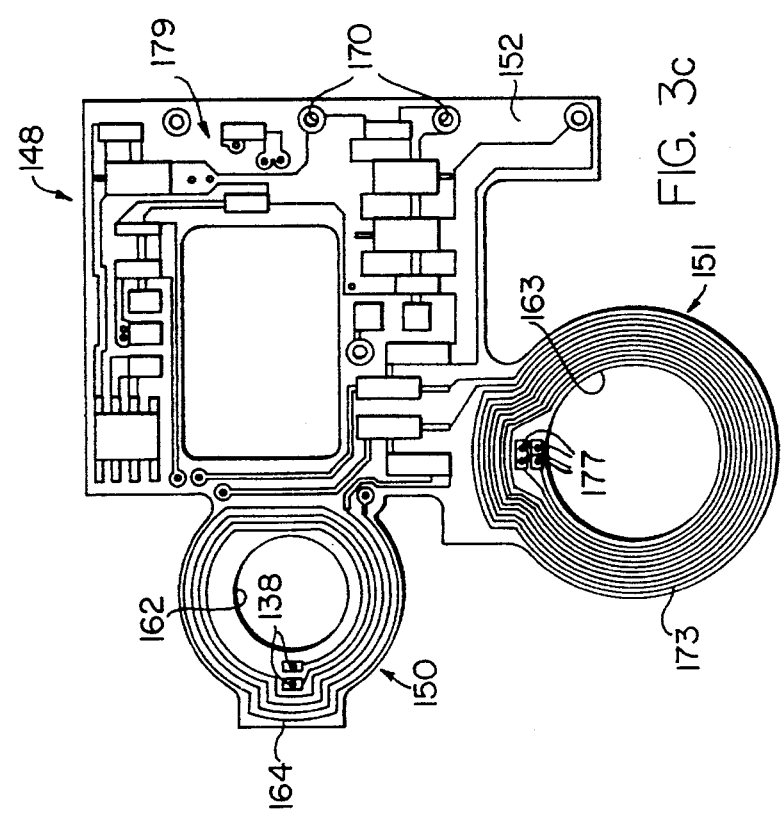
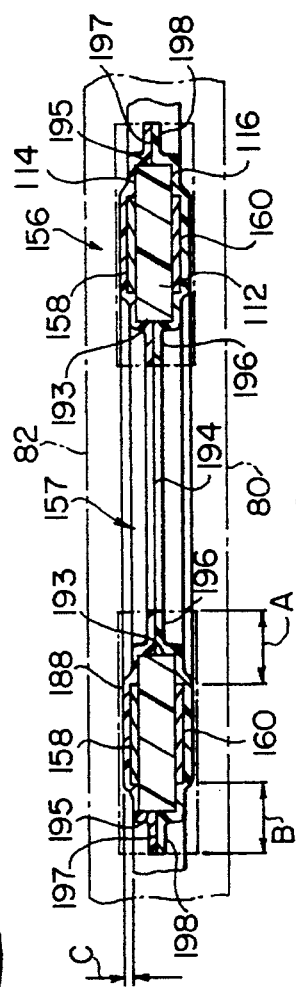

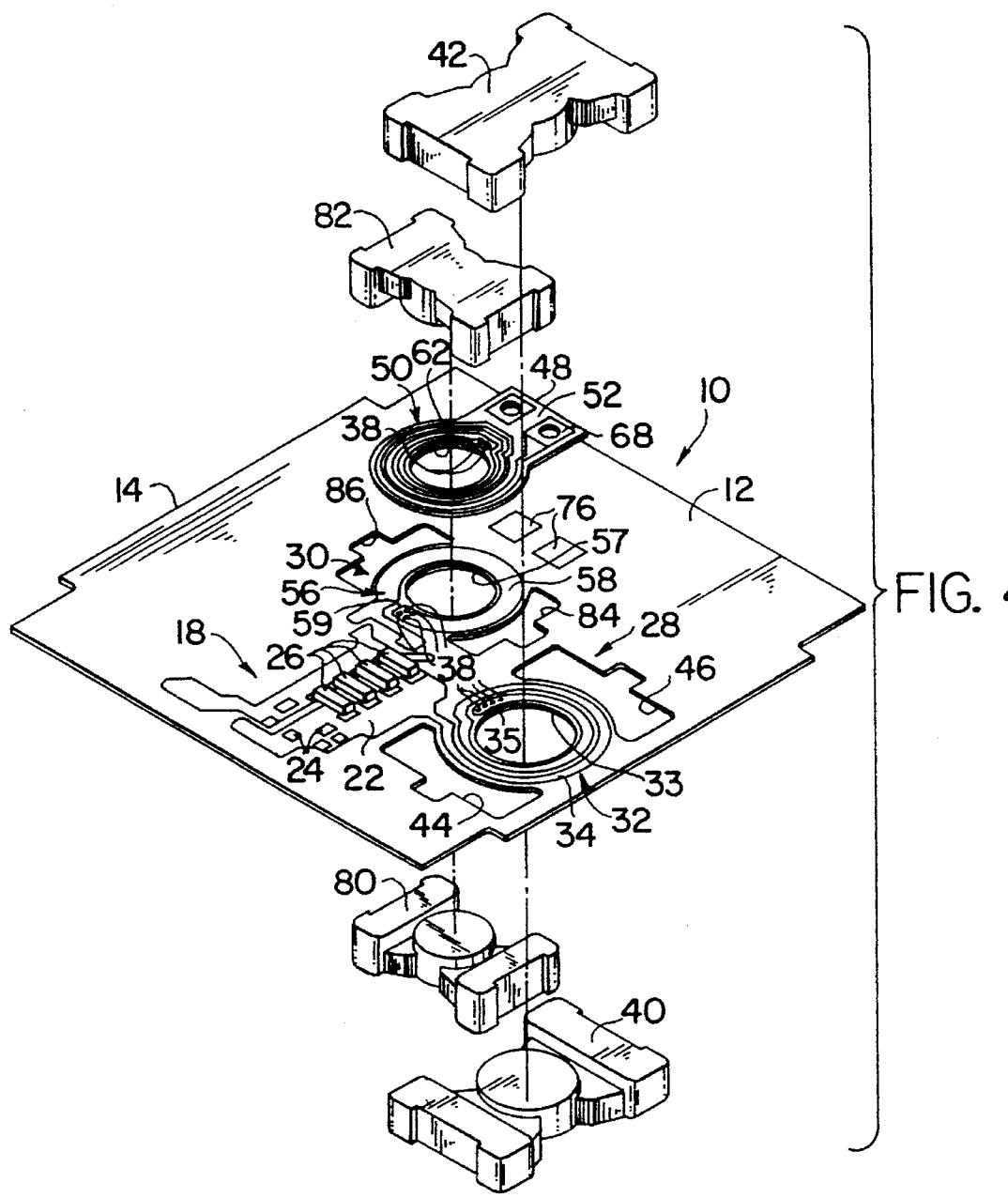
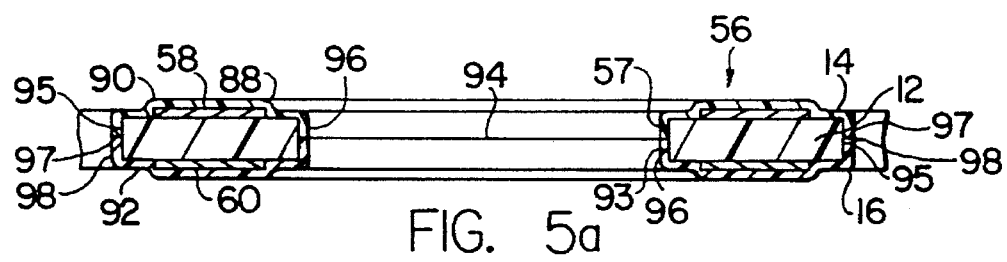

LOW PROFILE PRINTED CIRCUIT BOARD

CROSS-REFERENCE TO RELATED APPLICATION

This patent application is a continuation-in-part of U.S. patent application Ser. No. 07/973,042, filed Nov. 6, 1992 and now U.S. Pat. No. 5,321,380, in the names of Paul W. Godek and Michael J. Grennan, entitled "A LOW PROFILE PRINTED CIRCUIT BOARD", assigned to Power General Corporation of Canton, Mass.

BACKGROUND OF THE INVENTION

The present invention relates to a low-profile printed circuit board and, more particularly, relates to such a printed circuit board including planar magnetic elements, such as transformers, inductors, and like components.

Recent advances have been made in designing and building low profile printed circuit boards. In the quest for reliable, miniaturized, low profile circuits built on insulating substrates such as plastics and ceramics, there has been a shift from high profile components with solderable leads to chip mounted components. With the advent of thick-film technology and advanced etching techniques, there has been a further shift toward screen-printing or etching components and circuits such as resistors, capacitors and circuit conductor paths directly on a substrate. Such components are not only extremely low-profile, but also have proven to be temperature and vibration stable, repeatable and cost effective.

Although there are advantages associated with the printing or etching of components and circuits, it has been difficult to produce planar magnetic elements such as inductors and transformers by these methods. One reason for this difficulty is the limited surface area available on the substrate to accommodate the two-dimensional windings required to construct planar magnetic elements. Moreover, since the windings are printed in a roughly spiral shape, the inner terminus or end of the winding is surrounded by the outer turns of the spiral. Thus, a mechanical bridge together with possible solder connections or a multi-layer circuit is needed to connect the inner end of the winding with other circuitry on the substrate. Difficulties also arise in insulating the individual two-dimensional windings relative to each other, which are often stacked to form a planar magnetic element such as, for example, a transformer, and in insulating the windings relative to respective ferrite cores, such as in a transformer or inductor structure.

There have been attempts to overcome the various difficulties associated with printed circuit boards incorporating planar magnetic elements. U.S. Pat. No. 4,622,627 discloses a planar magnetic transformer which includes a primary winding formed on a first substrate and a secondary winding located on the same or opposite face of the first substrate or on a second substrate. Top and bottom inductive cores are connected together through apertures in the substrate(s) and magnetically coupled with the windings. While it is possible to achieve a low-profile transformer in this manner, there remains the problem of the inner terminus of the winding being surrounded by the outer turns of the spiral. Accordingly, a mechanical connection or additional dielectric and conductive layers are necessary to connect the inner terminus of the winding with other circuitry on the substrate. In addition to these problems, valuable substrate surface area is sacrificed where both the primary and secondary windings of the transformer are placed on the same substrate.

U.S. Pat. No. 4,543,553 attempts to overcome the problem of limited surface area by stacking double-sided magnetic layers on top of one another to simulate a three-dimensional coil. Each of the double-sided magnetic layers contains a single, printed turn of a rectangular coil, and the layers are staggered in relation to one another so that both sides of each layer add turns to the coil. Corresponding conductive turns on the upper and lower sides of selected magnetic layers are electrically connected and mechanically adhered to one another by heating, crimping and sintering the layers via through-holes provided in a middle-layer positioned between the top and bottom layers. Thus, a laminated structure is formed, and electrodes are subsequently placed on opposite ends of the laminated structure in order to form a chip inductor. Although the above-mentioned process uses printed conductor turns, the advantages of a low-profile device having a two-dimensional screen-printed or etched winding are lost through stacking of the magnetic layers. Moreover, the process for electrically and mechanically connecting the coil turns and the need for additional electrodes adds expense and makes fabrication of the chip inductor difficult.

U.S. Pat. No. 5,010,314 also discloses planar magnetic elements. The patent teaches two flat bobbin trays each having a raised rectangular guide at its center. The trays house substrates supporting the primary and secondary spiral conductive patterns of a transformer. Layers of dielectric sheet material are provided between the substrate layers supporting the windings as well as between the two bobbin trays. Top and bottom inductive cores extend through an aperture formed in the center of the bobbins, the substrates and the dielectric layers so as to magnetically couple the planar windings to the core. Connections between different conductive layers are established by solder leads that extend beyond the perimeter of the laminated structure. The use of bobbins in the configuration eliminates the advantages associated with a low-profile, planar element. Moreover, the plurality of layers needed to form the element and the solder leads required for connections between layers make the transformer both expensive and difficult to fabricate.

Another prior approach to constructing planar conductive circuits, including planar windings, has been to encapsulate the windings in sheets of polyamide, which has been commercially available under the trade name "Kapton". In one such device made by Tech-Etch of Plymouth, Mass., a circular, planar winding was encapsulated within the polyamide, with the polyamide forming margins along the inner and outer perimeters of the winding. The winding was not surface mounted on a substrate, but rather was encapsulated by itself within the polyamide forming a relatively flexible winding structure. One drawback with this approach is that the polyamide insulating material is quite expensive, and virtually cost prohibitive for commercial electronic applications. Moreover, the polyamide is relatively difficult and expensive to work with. For example, because of the shear strength of the material, a heavy-tonnage press is required in order to cut the polyamide sheets cleanly and in desired patterns necessary for printed circuit applications.

Accordingly, it is a general object of the present invention to provide a low-profile printed circuit board which includes at least one planar magnetic element formed integrally with other circuitry carried on the board.

It is another object of the invention to provide a planar magnetic element which does not require mechanical connections to connect windings or portions of windings with one another or with other circuitry on the printed circuit board.

It is another object of the present invention to electrically insulate the windings or portions of the windings comprising such a planar magnetic element from one another and/or from respective conductive cores without the need for bobbins or the expensive dielectric layers used in the past.

It is a further object of the present invention to provide additional substrates or printed circuit boards including one or more second planar magnetic windings, such as secondary transformer windings and/or coupled inductor windings, for surface mounting onto the primary circuit board so that each second winding is overlying a respective first winding on the primary board for creating a multiple output device.

These and other objects and advantages of the present invention will become apparent in view of the following summary, detailed description and accompanying drawings of the present invention.

SUMMARY OF THE INVENTION

The present invention meets these and other objects by providing a low-profile printed circuit board which includes a substrate having a conductive circuit formed on both sides thereof. The printed circuit board further includes at least one planar magnetic element supported on the substrate. The planar magnetic element includes a winding comprising at least one spiral conductive pattern disposed on at least one side of the substrate integrally with the conductive circuit formed on that side. The spiral pattern has an inner end and an outer end, and the outer end of the spiral pattern is connected with at least a portion of the conductive circuit. The spiral pattern is magnetically coupled to an inductive core which is mounted on both sides of the substrate and extends through apertures formed in the substrate. Together, the spiral pattern and the inductive core provide a closed magnetic loop. At least one through-hole plated with an electrically conductive coating is provided in the substrate. The through-hole provides a conductive path to connect the inner end of the spiral conductive pattern with the conductive circuit formed on the opposite side of the substrate or to continue the spiral pattern from one side to the opposite side of the substrate.

In one embodiment of the invention, the printed circuit board further comprises at least a second substrate having a winding comprising at least a second spiral conductive pattern disposed on one side thereof. That is, the printed circuit board includes one or more substrates having a spiral conductive pattern disposed on one side thereof, in addition to the first substrate. The second spiral pattern has an inner end which is electrically connected to at least one plated through-hole formed in the second substrate which provides a conductive path between the two sides of the second substrate. A first terminal is provided on the second substrate, and the outer end of the second spiral pattern is electrically connected to the first terminal on the same side of the second substrate which carries the second spiral pattern. A second terminal is also provided on the substrate, and the second terminal is electrically connected to the conductive path provided by the plated through-hole on the side of the second substrate opposite the side carrying the second spiral pattern. Alternatively, the second spiral pattern may continue from one side of the second substrate to the other side via the conductive path provided by the through-hole and connect with the second terminal. In either case, means for mounting the second substrate on the first substrate with the second spiral pattern in overlying relationship to the first spiral pattern are provided. When the second substrate is so mounted, the second spiral pattern is electrically connected to at least one of the conductive circuits formed on the first substrate via plated terminal throughholes formed in the first and second terminal pads.

As mentioned previously, it is often difficult in applications utilizing planar magnetic elements to provide complete isolation between stacked planar windings and between the windings and the inductive core to which they are magnetically coupled. Accordingly, it is another aspect of the invention to provide a dielectric barrier to isolate the first spiral pattern from the second spiral pattern and to isolate both spiral patterns from their associated inductive core.

In a preferred embodiment of the invention, the dielectric barrier is a coating of non-porous or dry solder mask which completely surrounds each spiral pattern. Preferably, the dielectric coating defines a first side overlying one face of the substrate and covering each spiral winding pattern on the respective face, and a second side overlying the other face of the substrate and covering each spiral winding pattern on the respective face for insulating the windings relative to any adjacent windings. The substrate also defines one or more apertures formed through the substrate, wherein each aperture is surrounded by a respective winding and receives an inductive core. The dielectric coating of the invention further defines an inner margin portion extending through each aperture and projecting into the aperture toward the inductive core for insulating the respective winding relative to the inductive core.

According to another aspect of the invention, the low-profile printed circuit device comprises a first substrate including a plurality of first or primary planar magnetic windings, each defining a first spiral conductive pattern on at least one side of the substrate and generating a respective electrical output. At least one second substrate includes a plurality of secondary planar magnetic windings, each defining a second spiral conductive pattern on at least one side of the second substrate and generating a respective electric output. The second substrate is surface mounted onto the first substrate, and each secondary winding overlies and is aligned with a respective first winding forming a respective planar magnetic component, and creating a multiple output device.

BRIEF DESCRIPTION OF THE DRAWINGS

FIG. 1 is a top plan view of a partially assembled printed circuit board according to the invention.

FIG. 2 is a bottom plan view of the partially assembled printed circuit board illustrated in FIG. 1.

FIG. 3a is a top plan view of a surface mounted component of the printed circuit board illustrated in FIG. 1.

FIG. 3b is a bottom plan view of a surface mounted component of the printed circuit board illustrated in FIG. 1.

FIG. 3c is a top plan view of another embodiment of a surface mounted component of the printed circuit board of FIG. 1.

FIG. 3d is a bottom plan view of the surface mounted component of FIG. 3c.

FIG. 4 is an exploded perspective view of a low-profile printed circuit board in accordance with the invention.

FIG. 5a is a cross-sectional view of the printed circuit board illustrated in FIG. 1 taken along the line 5—5 of FIG. 1 and illustrating a typical portion of the dielectric coating encapsulating the board for insulating the windings relative to each other and relative to the respective cores.

FIG. 5b is a cross-sectional view of a printed circuit board of the present invention illustrating in further detail the typical structure of the dielectric coating encapsulating the substrate and forming a seam and margin for maintaining a predetermined spacing between the windings and the respective cores in order to ensure optimal insulation of the windings relative to each other and relative to the respective cores.

DETAILED DESCRIPTION OF THE INVENTION

FIGS. 1–4 illustrate a low-profile printed circuit board according to the invention. The printed circuit board 10 comprises a substrate 12 having a first side 14 and a second side 16. The substrate 12 is preferably composed of a typical printed circuit board material, such as "FR-4", which comprises fiberglass and epoxy, or other known substrate material, such as plastic or ceramic. Each of the sides 14 and 16 has a conductive circuit, shown generally at 18 and 20, respectively, formed thereon. The conductive circuits 18, 20 include, for example, interconnect paths 22, 22 and bases 24, 24 to which discrete circuit components 26, 26, such as, for example, transistors, capacitors, diodes and the like are attached. As those skilled in the art will recognize, the conductive circuits may be formed by selectively etching portions of a conductive coating (not shown), such as a copper coating, applied to the substrate 12. Alternatively, the conductive circuits may be formed by thick-film technology, such as by screen-printing on the substrate with a conductive paste.

The printed circuit board 10 further includes at least one planar magnetic element. As shown in FIG. 4 such elements include, for example, the planar magnetic inductor 28, which includes inductor winding 32 and inductive core halves 40, 42, and transformer 30, which includes primary winding 56, secondary winding 50 and inductive core halves 80, 82.

Referring in particular to FIGS. 1 and 2, the inductor 28 comprises a planar inductor winding 32 disposed around an aperture 33 formed in the substrate. It is an important aspect of the invention that the inductor winding 32 is formed integrally with the conductive circuits 18 and 20. That is, a spiral conductive pattern 34 having an inner end 35 is etched or deposited at the same time and integrally with the circuit 18 when it is formed on side 14 of substrate 12, and a corresponding spiral conductive pattern 36 having an inner end 37 is etched or deposited at the same time and integrally with circuit 20 when it is formed on side 16 of substrate 12. The substrate 12 has at least one through-hole 38 (four are illustrated) formed therein. The boundaries of the hole are coated with a conductive plating to provide a conductive path that connects the inner end 35 of spiral pattern 34 with the inner end 37 of spiral pattern 36 to complete planar winding 32. As can be readily appreciated, plated through-holes 38 also provide a conductive path connecting spiral pattern 34 and conductive circuit 18 with conductive circuit 20. Thus, the plated through-holes completely eliminate the need for the mechanical bridges and solder connections or the multi-layer circuits used in the prior art to connect the inner end of a planar spiral winding with other circuitry on a printed circuit board including such a winding.

The spiral patterns 34, 36 are illustrated in the figures as two circular winding turns. This need not be the case however. Depending on the circuit design, the spirals could have almost any shape; for example, the spirals could be square-shaped, rectangular or elliptical. Again, depending on the requirements of the circuit, the planar winding could include one or any number of turns. Moreover, in particular instances it may not be necessary to continue the spiral conductive pattern via the through-hole from one side of the substrate to the opposite side. A winding formed from a spiral pattern disposed on one side of the substrate only may be sufficient. Of course, even in such a case the plated through hole would be necessary to provide a conductive path between the winding and its associated conductive circuit and the conductive circuit formed on the opposite side of the substrate.

As shown in FIG. 4, the inductor 28 magnetically couples the planar winding 32 to an inductive core made, for example, from a ferrite material to form a closed magnetic loop. This is accomplished by mating two E-shaped core halves 40 and 42 which extend through aperture 33 and core slots 44 and 46. Once the core halves are mated, they are clipped or bonded together to complete the inductor. As is well-known to those skilled in the art, the inductive core may have a shape other than the illustrated E-shape; of course, the core slots may have to be altered accordingly.

Referring now to FIGS. 1–4, according to a second embodiment of the invention, a second substrate, such as the substrate 48 shown in FIGS. 3a and 3b, is provided. The second substrate has an additional planar winding 50 disposed on both sides 52 and 54 thereof. In the present case the additional planar winding forms the secondary winding of the transformer 30. Of course, those skilled in the art will appreciate that the additional winding 50 disposed on the second substrate 48 may have any number of other uses depending on the design of the particular circuit of which it forms a part. For example, the additional winding may provide additional winding turns for the inductor 28, as illustrated in FIGS. 3c and 3d and described further below.

Referring specifically now to the transformer 30 and to FIGS. 1 and 2, the transformer includes a planar primary winding 56 disposed around an aperture 57 formed in the first substrate 12. The primary winding of the transformer is illustrated here as a pair of single-turn spiral conductive patterns, wherein each pattern is disposed on a respective side of the substrate and is coupled in series with the other pattern, but could, as noted previously, be shaped differently and include additional turns depending on the requirements of the circuit. As in the case of the planar inductor winding 32, the primary winding 56 is formed integrally with the conductive circuits 18 and 20. Thus, a spiral conductive pattern 58 having an inner end 59 is etched or deposited at the same time and integrally with the circuit 18 when it is formed on side 14 of substrate 12, and a corresponding spiral conductive pattern 60 having an inner end 61 is etched or deposited at the same time and integrally with circuit 20 when it is formed on side 16 of substrate 12. At least one plated through-hole 38 (four are illustrated) is provided in substrate 12 to provide a conductive path which connects the inner end 59 of spiral pattern 58 with inner end 61 of spiral pattern 60 to complete primary winding 56. Further, as in the case of inductor 28, plated through-hole 38 also provides a conductive path connecting spiral pattern 58 and conductive circuit 18 with conductive circuit 20, without the need for mechanical bridges and solder connections or multi-layer circuits.

As previously noted, the planar winding 50 on the second substrate 48 provides the secondary winding for the transformer 30. As will be appreciated by those skilled in the art, however, the primary transformer winding may equally be disposed on the second substrate, and the secondary transformer winding disposed on the first substrate, if desired. As shown in FIGS. 3a and 3b, the secondary winding 50 is disposed around aperture 62 provided in substrate 48. The secondary winding 50 is formed by etching or screen-printing a spiral conductive pattern 64 and a spiral conductive pattern 66 on sides 52 and 54, respectively, of the second substrate 48. At least one plated through-hole 38 (two are illustrated) is formed in the second substrate to connect the inner end 65 of spiral pattern 64 with the inner end 67 of spiral pattern 66 to complete planar secondary winding 50.

The second substrate 48 also includes two terminals 68 and 70. The outer end 72 of spiral pattern 64 is electrically connected on side 52 of the second substrate to terminal 68. The outer end 74 of spiral pattern 66 is electrically connected on side 54 to terminal 70. Thus, planar secondary winding 50 begins at terminal 68, spirals around aperture 62 on side 52 of substrate 48, continues to the opposite side 54 of the second substrate via plated through-holes 38, spirals around aperture 62 on side 54 of substrate 48 and terminates at terminal 70 on side 54. Terminals 68 and 70 respectively include plated terminal through holes 69 and 71. Thus, the terminals 68 and 70 are electrically accessible from either side of the second substrate even when, as described below, the second substrate is surface mounted on the first substrate.

Referring in particular to FIG. 4, the transformer is assembled by first surface mounting the second substrate 48 onto substrate 12 with secondary winding 50 overlying primary winding 56 and with terminals 68 and 70 aligned and in contact with conductive receiving pads 76, 76 provided on substrate 12 for this purpose. The pads are etched or screen-printed onto substrate 12 at the same time conductive circuit 18 is formed thereon and are coated with a re-flowable solder. Thus, the second substrate 48 is mechanically attached to substrate 12 and the secondary winding 50 is electrically connected to the circuitry carried on substrate 12 by simply re-flowing the solder coated on the receiving pads 76, 76. During this process the terminal through-holes 69 and 71 not only permit electrical access to the terminals 68 and 70 from either side of the second substrate 48, but also allow visual inspection of the solder connection thereby insuring that the connections are complete. Of course, in a less-automated manufacturing process, the terminals 68 and 70 could be hand-soldered onto the receiving pads.

To complete the transformer 30, an inductive core is magnetically coupled to the primary and secondary windings to form a closed magnetic loop. As in the case of the inductor, this is accomplished by mating two E-shaped core halves 80 and 82 which extend through aperture 57 and core slots 84 and 86 in substrate 12 and through aperture 62 in substrate 48. Once the core halves are mated, they are clipped or bonded together to complete the transformer.

Turning to FIGS. 3c and 3d, another embodiment of a second substrate 148 is illustrated for surface mounting onto the substrate 12, and which includes both a secondary transformer winding forming a part of the transformer 30 and a coupled inductor winding forming a part of the inductor 28. The second substrate 148 is similar in many respects to the substrate 48 described above with reference to FIGS. 3a and 3b, and therefore like reference numerals preceded by the numeral 1 are used to indicate like elements.

As shown in FIGS. 3c and 3d, the second substrate 148 includes a first planar winding 150 forming the secondary transformer winding of the transformer 30, and a second planar winding 151 forming the coupled inductor winding of the inductor 28. Each of the first and second planar windings are disposed on both sides 152 and 154 of the second substrate 148, and are shaped and located relative to each other so that when the second substrate is surface mounted onto the first substrate 12, each winding on the second substrate is mounted in overlying relationship with a respective winding of the inductor or transformer on the first substrate, as is described further below.

The secondary transformer winding 150 includes a first spiral pattern 164 on the side 152 of the second substrate, and a second spiral pattern 166 on the opposite side 154 of the second substrate, each spiral pattern being formed around an aperture 162 extending through the substrate. The inner ends of the two spiral patterns 164 and 166 are coupled by plated through-holes 138 extending through the second substrate. The coupled inductor winding 151 similarly includes a first spiral pattern 173 on the side 152 of the second substrate, and a second spiral pattern 175 on the opposite side 154 of the second substrate, each spiral pattern being formed around an aperture 163 extending through the substrate. The inner ends of the two spiral patterns 173 and 175 are coupled by plated through-holes 177 extending through the second substrate.

As shown in FIGS. 3c and 3d, the outer ends of each spiral pattern 164, 166, 173 and 175 are coupled through conductive circuits 179 and 181 to one or more terminals 170, each terminal being formed by a plated through-hole extending through the second substrate. As shown in phantom in FIGS. 1 and 2, the first substrate 10 includes corresponding terminals 183, each such terminal being formed by a plated through-hole extending through the first substrate, and corresponding in position to a respective terminal 170 on the second substrate. Like the terminals described above, each terminal 170 and 183 is electrically accessible from either side of the respective substrate. Also, like the conductive circuits described above, the circuits 179 and 181 include, for example, interconnect paths and bases to which discrete circuit components, such as transistors, capacitors, diodes and like components are attached. The second substrate 148, along with the conductive circuits and windings of the second substrate, are formed of the same materials and in the same manner as the conductive circuits and windings of the first and second substrates 10 and 48 described above.

The second substrate 148 is coupled to the first substrate 10 by surface mounting or superimposing side 154 of the second substrate onto side 16 of the first substrate so that the secondary transformer winding 150 is overlying and aligned with the primary transformer winding 56, the coupled inductor winding 151 is overlying and aligned with the inductor winding 32, and each terminal 170 is aligned and in contact with a respective terminal 183. The second substrate 148 may be mechanically attached and electrically connected to the first substrate 12 by usage of conductive receiving pads (not shown) in the same manner as described above in connection with the second substrate 48 and with reference to FIG. 4. Alternatively, conductive pins (not shown) are each inserted through corresponding terminal through-holes 170 and 183, the pins are in turn connected to the terminals, and the terminals are mechanically attached and electrically connected to each other by usage of solder in a manner known to those of ordinary skill in the pertinent art. The transformer 30 and inductor 28 are each completed by attachment of the mating E-shaped core halves to each planar magnetic component, as described above with reference to FIG. 4.

One advantage of this embodiment of the present invention, is that a single output device, such as a power supply as illustrated, can be easily transformed into a multiple output device. By adding the additional printed circuit board, like the substrate 148, including a secondary transformer winding, a coupled inductor winding, and any other additional windings and/or surface mounted components which may be added as desired, each such additional winding creates an additional electrical output, thus creating a multiple output device. Because of the planar magnetic construction, and resultant close coupling of each secondary winding on the second substrate with the respective primary winding on the first substrate, a significant improvement in cross-regulation is achieved in comparison to prior art devices.

Referring now to FIG. 5a, the primary transformer winding 56 includes a coating 88 of a dielectric material which has been used in the past as a solder mask. The dielectric solder mask is applied as sheets 90 and 92 to sides 14 and 16, respectively, of the substrate 12. Portions of each sheet are selectively removed by well-known methods to provide the coating 88 which completely covers the spiral conductive patterns 58 and 60 that comprise the primary transformer winding 56. The sheets 90 and 92 extend into aperture 57 beyond the inner edge 93 of substrate 12 which defines aperture 57 and join at seam 94 to provide margin 96. The sheets also extend beyond the outer edge 95 of that portion of substrate 12 on which winding 56 is disposed and join at seam 97 to form margin 98. This ensures that the primary winding 56 is completely insulated from both secondary winding 50 and the inductive core formed from core halves 80 and 82. While not illustrated in detail, inductor winding 32 and the secondary transformer winding 50 include this same coating. Thus, as can be seen, the substrate 12 is encapsulated by the dielectric coating 88, particularly in the vicinity of the primary transformer winding 56 and inductor winding 32, so that all windings are insulated relative to each other and relative to the respective cores.

Turning to FIG. 5b, the preferred seam and margin structure of the present invention is illustrated in further detail. The embodiment of FIG. 5b is substantially the same as the embodiment of FIG. 5a, and therefore like reference numerals preceded by the numeral 1 are used to indicate like elements. As can be seen, FIG. 5b illustrates in further detail the manner in which the inner seam and margin 194 and 196, respectively, of the dielectric coating 188 project inwardly toward the center of the aperture 157, and the outer seam and margin 197 and 198, respectively, of the dielectric coating project outwardly in substantially the opposite direction. As shown in FIG. 5b, the inner seam and margin terminate a distance A from the inner edge of the winding 156, the outer seam and margin terminate a distance B from the outer edge of the respective winding, and the coating defines a typical thickness C over each face of the respective substrate.

The distances A and B are selected to ensure sufficient spacing between the spiral winding patterns of the substrate and the inner and outer surfaces of the inductive cores 80 and 82, as illustrated typically in phantom lines in FIG. 5b, to adequately insulate the windings relative to the cores. The thickness C, on the other hand, depends on the voltage gradiant of the device and is selected to ensure sufficient insulation between adjacent, overlying windings (typically, there are at least two such planar windings stacked on top of one another, if not more). In the illustrated embodiment, the distances A and B are typically at least approximately 3 mm, and the thickness C is approximately 0.006 inch (thus providing a coating thickness of about 0.012 inch between overlying or stacked windings). These dimensions are exemplary, however, and as described above, are selected depending upon the characteristics of a particular circuit in order to ensure that the windings are adequately insulated relative to each other and relative to the respective cores.

Although not illustrated in detail, the seam and margin surrounding each of the inductor winding 32, the secondary winding 50 of the second substrate 48, and the windings 150 and 151 of the second substrate 148, are preferably constructed in the same manner as illustrated in FIG. 5b in order to ensure optimal insulation of the spiral winding patterns not only relative to each other, but relative to the respective inductive cores. One advantage of the dielectric coating of the present invention, and particularly the margin structure formed by the coating, is that it not only ensures insulation of the winding patterns relative to the respective cores and each other, but it eliminates the need for a separate bobbin or like insulating member between the core and the winding as taught by the prior art.

As noted previously, each of the coatings 88 and 188 comprises a dry solder mask which, in the present case is also used as a dielectric. The dry solder mask is non-porous, and is typically provided in sheet form. It is noted that another solder mask or like dielectric coating which may become known to those skilled in the art may be used as long as the mask or coating has a dielectric strength of at least about 500 V/0.001 inch and a dielectric constant of at least about 1.5. The required isolation voltage determines the thickness of the coating 88 or 188, and the coating may be applied as a single layer or as multiple layers to reach the desired thickness. In the preferred embodiment of the invention, the solder mask has a dielectric strength of about 500 V/0.001 inch and a dielectric constant of about 3.6. Also in a preferred embodiment of the invention, the coating is formed from a dielectric solder mask sold under the trademark VACREL, available from Dupont Electronics, Burlington, Mass.

While preferred embodiments have been shown and described, various modifications and substitutions may be made without departing from the spirit and scope of the invention. Accordingly, it is to be understood that the present invention has been described by way of example and not by limitation.

We claim:

1. A low-profile printed circuit device, comprising:

a substrate defining a first side, a second side opposite the first side, and a first aperture extending through the substrate;

a planar magnetic transformer, including a primary transformer winding defining a first spiral conductive pattern disposed on the first side of the substrate adjacent to the first aperture, a second spiral conductive pattern disposed on the second side of the substrate adjacent to the first aperture, and an inductive core mounted on both sides of the substrate and defining an inner portion extending through the first aperture, the inductive core being magnetically coupled to the first and second spiral conductive patterns forming a magnetic loop; and a dielectric coating comprised of a substantially non-porous solder mask defining a first side overlying the first side of the substrate and covering the first spiral conductive pattern, a second side overlying the second side of the substrate and covering the second spiral conductive pattern, and an inner margin portion extending through the first aperture between the first and second sides of the coating and covering the surface of the substrate defining the first aperture, the inner margin portion projecting into the first aperture toward the inductive core and insulating the first and second spiral conductive patterns relative to the core.

2. A low-profile printed circuit device as defined in claim 1, wherein the dielectric coating exhibits one of a dielectric strength of at least approximately 500 V/0.001 inch and a dielectric constant of at least approximately 1.5.

3. A low-profile printed circuit device as defined in claim 1, wherein the substrate defines at least one second aperture extending through the substrate on an opposite side of a portion of the primary transformer winding relative to the first aperture for receiving an outer portion of the inductive core, and wherein the dielectric coating defines an outer margin portion extending through the second aperture between the first and second sides of the coating and covering the surface of the substrate defining the second aperture, the outer margin portion projecting into the second aperture toward the outer portion of the inductive core and insulating the first and second spiral conductive patterns relative to the core.

4. A low-profile printed circuit device as defined in claim 1, wherein the substrate defines an outer edge portion on an opposite side of a portion of the primary transformer winding relative to the first aperture, and the inductive core defines an outer portion extending between the first and second sides of the substrate adjacent to the outer edge portion, and wherein the dielectric coating defines an outer margin portion covering the outer edge portion and extending between the first and second sides of the coating, the outer margin portion also projecting outwardly toward the outer portion of the inductive core and insulating the first and second spiral conductive patterns relative to the core.

5. A low-profile printed circuit device as defined in claim 1, further comprising:
  a second substrate defining an inner aperture extending through the substrate; and
  a secondary transformer winding defining at least one spiral conductive pattern disposed on the second substrate adjacent to the inner aperture, the second substrate being surface mounted onto the other substrate with the inner aperture of the second substrate receiving the inner portion of the inductive core, and the secondary transformer winding facing and overlying the first or second spiral conductive pattern of the primary transformer winding and forming a secondary winding of the planar magnetic transformer.

6. A low-profile printed circuit device as defined in claim 5, wherein the second substrate further comprises a dielectric coating defining a first side overlying one side of the second substrate, a second side overlying an opposite side of the second substrate, the first and second sides covering the secondary transformer winding, and an inner margin portion extending through the inner aperture between the first and second sides of the coating and covering the surface of the substrate defining the inner aperture, the inner margin portion projecting into the inner aperture toward the inductive core and insulating the secondary transformer winding relative to the core.

7. A low-profile printed circuit device as defined in claim 1, wherein at least one of the spiral conductive patterns is substantially circular.

8. A low-profile printed circuit device, comprising:
  a first substrate;
  a first planar magnetic component, including a first primary winding defining a first spiral conductive pattern disposed on at least one side of the first substrate, and generating a first electrical output;
  a second substrate; and
  a secondary winding defining a second spiral conductive pattern disposed on at least one side of the second substrate, the second substrate being surface mounted onto the first substrate with the secondary winding facing the primary winding, the secondary winding forming a part of the first planar magnetic component and generating a second electrical output separate from the first electrical output to thereby provide a multiple output device.

9. A low-profile printed circuit device as defined in claim 8, wherein at least one of the spiral conductive patterns is substantially circular.

10. A low-profile printed circuit device as defined in claim 8, further including a first dielectric coating comprised of a substantially non-porous solder mask covering the first spiral conductive pattern and a second dielectric coating comprised of a substantially non-porous solder mask covering the second spiral conductive pattern.

11. A low-profile printed circuit device as defined in claim 8, wherein the first substrate defines a first aperture substantially surrounded by the first primary winding, and the second substrate defines a second aperture substantially surrounded by the secondary winding, and the device further comprises a common inductive core received by the first and second apertures.

12. A low-profile printed circuit device as defined in claim 11, wherein the first and second substrates each include a dielectric coating, each dielectric coating encapsulating the respective substrate and defining a margin portion projecting into the respective first or second aperture toward the common inductive core and insulating the windings relative to the core.

13. A low-profile printed circuit device comprising:
  a first substrate;
  a first planar magnetic component, including a first primary winding defining a first spiral conductive pattern disposed on at least one side of the first substrate, and generating a first electrical output;
  a second substrate;
  a secondary winding defining a second spiral conductive pattern disposed on at least one side of the second substrate, the second substrate being surface mounted onto the first substrate with the secondary winding facing the primary winding, the secondary winding forming a part of the first planar magnetic component and generating a second electrical output;
  a second planar magnetic component spaced relative to the first planar magnetic component on the first substrate, including a second primary winding defining another spiral conductive pattern disposed on at least one side of the first substrate, and generating a third electrical output; and
  another secondary winding defining another spiral conductive pattern disposed on at least one side of the second substrate, the other secondary winding overlying the second primary winding and forming a part of the second planar magnetic component and generating a fourth electrical output.

14. A low-profile printed circuit device as defined in claim 13, wherein the first and second planar magnetic components are each selected from the group including a planar magnetic transformer and a planar magnetic inductor.

15. A low-profile printed circuit device, comprising:
  a first substrate;
  a first planar magnetic component, including a first primary winding defining a first spiral conductive pattern disposed on at least one side of the first substrate, and generating a first electrical output;

a second substrate; and a secondary winding defining a second spiral conductive pattern disposed on at least one side of the second substrate, the second substrate being surface mounted onto the first substrate with the secondary winding facing the primary winding, the secondary winding forming a part of the first planar magnetic component and generating a second electrical output for providing a multiple output device, wherein the first substrate defines a first aperture substantially surrounded by the first primary winding for receiving an inductive core, the second substrate defines a second aperture substantially surrounded by the secondary winding for receiving an inductive core, and the first and second substrates each include a dielectric coating, each dielectric coating encapsulating the respective substrate and defining a margin portion projecting into the first or second aperture toward the core and insulating the windings relative to the core.

16. A low-profile printed circuit device as defined in claim 15, wherein each dielectric coating is comprised of a substantially non-porous solder mask.

17. A low-profile printed circuit device as defined in claim 15, wherein the dielectric coating exhibits one of a dielectric strength of at least approximately 500 V/0.001 inch and a dielectric constant of at least approximately 1.5.

* * * * *